United States Patent
Takeno et al.

(10) Patent No.: US 7,311,888 B2
(45) Date of Patent: Dec. 25, 2007

(54) ANNEALED WAFER AND METHOD FOR MANUFACTURING THE SAME

(75) Inventors: Hiroshi Takeno, Annaka (JP); Masahiro Sakurada, Fukushima (JP); Takeshi Kobayashi, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 241 days.

(21) Appl. No.: 10/530,557

(22) PCT Filed: Sep. 29, 2003

(86) PCT No.: PCT/JP03/12396

§ 371 (c)(1), (2), (4) Date: Apr. 7, 2005

(87) PCT Pub. No.: WO2004/034457

PCT Pub. Date: Apr. 22, 2004

(65) Prior Publication Data

US 2006/0075957 A1    Apr. 13, 2006

(30) Foreign Application Priority Data

Oct. 8, 2002    (JP)    ............................ 2002-294713

(51) Int. Cl.
*C30B 15/20* (2006.01)
*C23C 33/36* (2006.01)

(52) U.S. Cl. ........................ 423/328.2; 117/13; 117/19; 117/20

(58) Field of Classification Search .................. 117/13, 117/19, 20; 423/328.2
See application file for complete search history.

(56) References Cited

U.S. PATENT DOCUMENTS

| 4,437,922 A | 3/1984 | Bischoff et al. |
| 5,286,658 A | 2/1994 | Shirakawa et al. |

(Continued)

FOREIGN PATENT DOCUMENTS

EP    0 090 320 A1    10/1983

(Continued)

OTHER PUBLICATIONS

PCT International Search Report for PCT/JP03/12396 mailed on Dec. 24, 2003.

*Primary Examiner*—Felisa Hiteshew
(74) *Attorney, Agent, or Firm*—Cheng Law Group PLLC (57) ABSTRACT

The present invention provides an annealed wafer which has a wafer surface layer serving as a device fabricating region and having an excellent oxide film dielectric breakdown characteristic, and a wafer bulk layer in which oxide precipitates are present at a high density at the stage before the wafer is loaded into the device fabrication processes to give an excellent IG capability, and a method for manufacturing the annealed wafer. The present invention is directed to an annealed wafer obtained by performing heat treatment on a silicon wafer manufactured from a silicon single crystal grown by the Czochralski method, wherein a good chip yield of an oxide film dielectric breakdown characteristic in a region having at least a depth of up to 5 μm from a wafer surface is 95% or more, and a density of oxide precipitates detectable in the wafer bulk and each having a size not smaller than a size showing a gettering capability is not less than $1 \times 10^9/cm^3$.

24 Claims, 5 Drawing Sheets

U.S. PATENT DOCUMENTS

| | | |
|---|---|---|
| 5,968,264 A | 10/1999 | Iida et al. |
| 6,159,438 A | 12/2000 | Iida et al. |
| 6,364,947 B1 | 4/2002 | Iida et al. |
| 6,514,335 B1 | 2/2003 | Egashira et al. |
| 2003/0116082 A1 | 6/2003 | Sakurada et al. |

FOREIGN PATENT DOCUMENTS

| | | |
|---|---|---|
| EP | 0 502 471 A2 | 9/1992 |
| EP | 0 890 662 A1 | 1/1999 |
| EP | 1 035 234 A1 | 9/2000 |
| JP | 58-171826 A1 | 10/1983 |
| JP | 04-276627 A1 | 10/1992 |
| JP | 04-283934 A1 | 10/1992 |
| JP | 05-062984 A1 | 3/1993 |
| JP | 11-079889 A1 | 3/1999 |
| JP | 11-130593 A1 | 5/1999 |
| JP | 11-217296 A1 | 8/1999 |
| JP | 11-236293 A1 | 8/1999 |
| JP | 2000-016897 A1 | 1/2000 |
| JP | 2000-072590 A1 | 3/2000 |
| JP | 2002-134517 A1 | 5/2002 |
| WO | WO-99/10570 A1 | 3/1999 |
| WO | WO-02/053812 A1 | 7/2002 |

ANNEALED WAFER AND METHOD FOR MANUFACTURING THE SAME

This application is a 371 of PCT/JP03/12396 Sep. 9, 2003.

TECHNICAL FIELD

The present invention relates to an annealed wafer having a wafer surface layer with an excellent oxide film dielectric breakdown characteristic and a wafer bulk layer with an excellent gettering capability, and a method for manufacturing the annealed wafer.

BACKGROUND ART

In recent years, with miniaturization of a device in consequence of an increase in an integration level of a semiconductor circuit, there have risen quality requirements for a silicon single crystal serving as a substrate of the semiconductor circuit and grown by a Czochralski method (hereinafter referred to, for brevity, as the "CZ method"). In particular, there exist defects due to single crystal growth called grown-in defects such as FPD, LSTD, and COP, which deteriorate an oxide film dielectric breakdown characteristic and the characteristics of a device. A decrease in the density and sizes of the defects is regarded as important.

In explanation of these defects, first there will be described below generally known matters for factors to determine a taken in concentration each of a void type point defect called vacancy (hereinafter may be also briefly referred to as V), and an interstitial silicon point defect called interstitial-Si (hereinafter may be also briefly referred to as I) both taken in a silicon single crystal.

In a silicon single crystal, a V region is a vacancy, i.e., a region rich in recessed portions, holes and the like formed due to shortage of silicon atoms, and an I region is a region rich in dislocations and blocks of silicon atoms generated by the presence of excessive silicon atoms. As a result, a neutral (hereinafter may be also briefly referred to as N) region in which atoms are not short or excessive (or rarely short or excessive) is present between the V region and the I region. It has been come out that grown-in defects (FPD, LSTD, COP, and the like) absolutely generate when the V or I is oversaturated, and when the V or I is not saturated, even though the distribution of atoms may be slightly biased, the above defects are not present.

The densities of both the point defects are determined depending on the relationship between a pulling rate (growth rate) of a crystal in the CZ method and a temperature gradient G in the neighborhood of a solid-liquid interface in the crystal. It is confirmed that in the neighborhood of the boundary between the V region and the I region, defects called an OSF (Oxidation Induced Stacking Fault) are distributed in the form of a ring (hereinafter may be also referred to as an OSF ring) when seeing them as a cross section in a direction perpendicular to the crystal grow axis.

Figure 9:
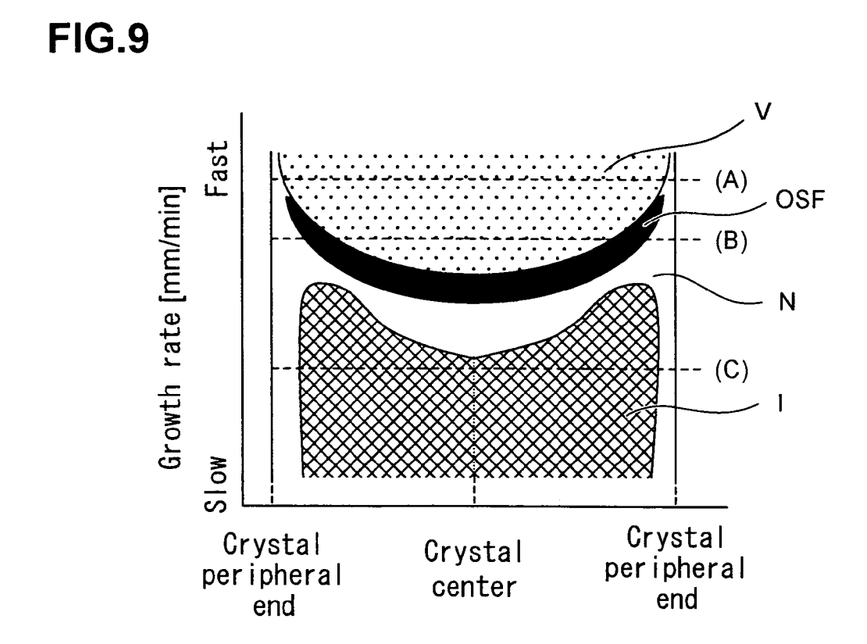
FIG. 9 is an explanatory view showing an example of a relationship between a single crystal growth rate and a crystal defect distribution.

These defects due to crystal growth are exhibited as a defect distribution map as shown in FIG. 9 when there is changed from high to low a growth rate of a crystal along a crystal axis by a CZ pulling machine using an in-furnace structure (hot zone: may be also referred to as an HZ) having a temperature gradient in the neighborhood of a usual solid-liquid interface in the crystal.

These defects caused by crystal growth are classified as follows. When the growth rate is relatively high, e.g., about 0.6 mm/min or more, there exist grown-in defects such as FPD, LSTD, and COP due to voids where void-type point defects collect together at a high density in an entire area in a direction of crystal diameter. The region in which these defects exist is called a V region (line (A) in FIG. 9).

When the growth rate is below 0.6 mm/min, with a decrease in growth rate, an OSF ring generates in the periphery of the crystal, and defects of L/D (Large Dislocation: an abbreviation of an interstitial dislocation loop, LSEPD, LFPD or others) which are considered to be due to a dislocation loop exist outside the ring at a low density. The region where these defects exist is called an I region (may be also referred to as an L/D region). In addition, when the growth rate is lowered to about 0.4 mm/min or less, the OSF ring aggregates and becomes extinct about the center of the wafer, thereby the entire region turning into the I region (line (C) in FIG. 9).

In recent years, the presence of a region, called an N region, which does not include FPD, LSTD, and COP due to the voids, and LSEPD and LFPD due to the dislocation loop is detected outside the OSF ring between the V region and the I region. It is reported that the N region exists outside the OSF ring, and when the N region is subjected to an oxygen precipitation heat treatment and then the contrast of the precipitation is checked by X-ray observation or the like, oxygen is rarely precipitated therein and the N region is on the I region side which is not so rich that LSEPD and LFPD are formed.

Since the N region exists diagonally to the growth axis direction in a usual method when a growth rate is decreased, the N region exists partly on a wafer surface (line (B) in FIG. 9). As to the N region, the Voronkov theory (V. V. Voronkov; Journal of Crystal Growth, 59 (1982) 625 to 643) advocates that a parameter, i.e., F/G that is a ratio of a pulling rate (F) to a temperature gradient (G) in an axial direction of a crystal solid-liquid interface determines a total concentration of point defects. Depending on the theory, since the pulling rate should be constant on the wafer surface, due to a distribution of the temperature gradient (G) on the wafer surface, for example, there could be only obtained a crystal in which the N region is sandwiched between the V region at the center and the I region at the periphery.

Recently, by improving the distribution of the temperature gradient (G) on the wafer surface, for example, when the crystal is pulled while gradually decreasing the pulling rate (F), there can be produced a crystal where the N region which exists only diagonally in a prior art spreads on a lateral entire surface at a certain pulling rate. In order to longitudinally enlarge the crystal where the N region spreads on a lateral entire surface, it is enough to some extent to pull the crystal while keeping a pulling rate at which the N region laterally spreads. In addition, considering the fact that the temperature gradient (G) changes in company with the growth of crystal, the change of the temperature gradient (G) is compensated, and the pulling rate is controlled such that the F/G is constant; therefore the crystal portion where the N region entirely spreads can also be enlarged in the growing direction (for example, JP A 8-330316).

The N region is further classified into an Nv region (a region rich in the voids) adjacent to the outside of the OSF ring and an Ni region (a region rich in the interstitial silicon) adjacent to the I region. It became clear that when performing thermal oxidation treatment, in the Nv region, there is generated a large amount of oxide precipitates and in the Ni region, there are rarely generated oxide precipitates (for example, JP A 2001-139396).

However, it has become clear that a very large number of oxide film defects may be generated even in a single crystal where an N region spreads on the entire surface, an OSF ring is not generated when performing thermal oxidation treatment, and FPD and L/D are not present on the entire surface. This is a cause of deteriorating electric characteristics such as an oxide film dielectric breakdown characteristic. In order to realize excellent electric characteristics, there is not satisfied the conventional single crystal where the N region spreads on the entire surface, and further improvements are desired.

Figure 10:
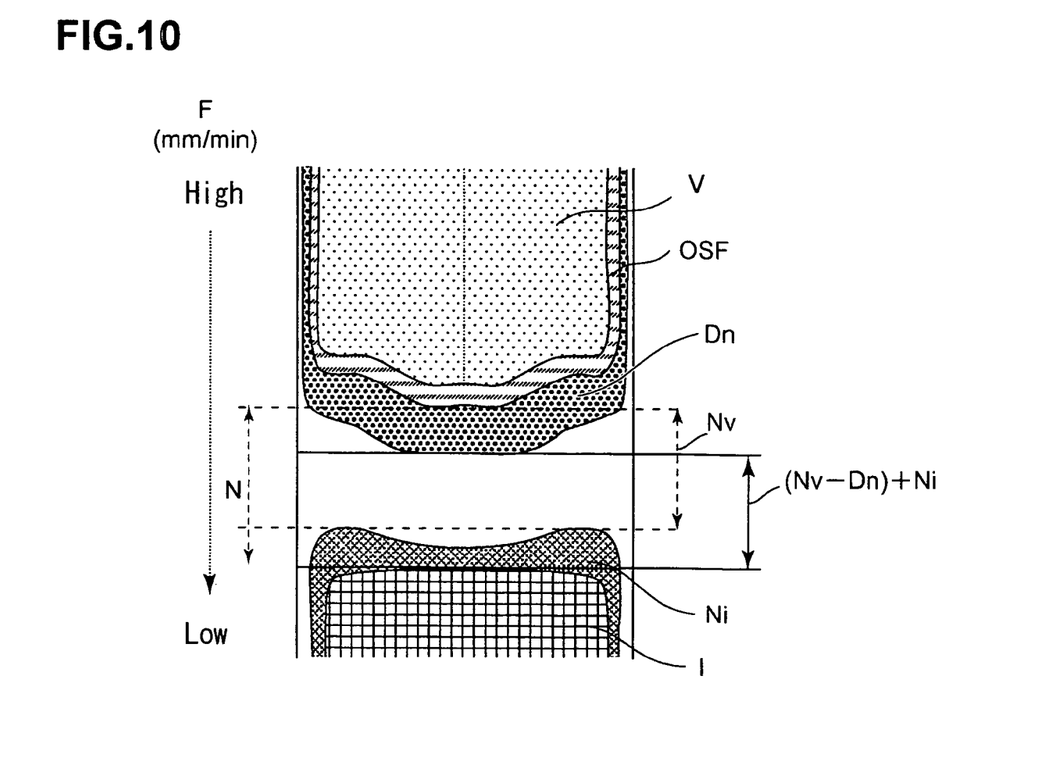
FIG. 10 is an explanatory view showing another example of the relationship between a single crystal growth rate and a crystal defect distribution.

Some of the present inventors have more exactly examined an N region by a Cu deposition method and have found that there exists a region Dn in which defects detected by the Cu deposition method drastically are generated, and which exists in the N region outside the OSF region and in a part of an Nv region where oxide precipitates easily generate after performing precipitation heat treatment (FIG. 10). The inventors have located the fact that the Dn region is a cause of deteriorating electric characteristics such as an oxide film dielectric breakdown characteristic, which already has been taught (JP A 2002-201093).

Therefore, if there can be spread on the entire wafer surface a region which is the N region outside the OSF region and is free from a defect region Dn detected by the Cu deposition method, there can be obtained a wafer which is free from the various grown-in defects and can reliably improve an oxide film dielectric breakdown characteristic or the like.

The Cu deposition method is a wafer evaluation method that can accurately measure the positions of defects of a semiconductor wafer, can improve detection limit to the defects of the semiconductor wafer, and can accurately measure and analyze more microscopic defects.

In a concrete wafer evaluation method, an insulating film having a predetermined thickness is formed on a wafer surface, and the insulating film on a defective portion formed in the vicinity of the surface of the wafer is broken to deposit an electrolyte such as Cu at the defective portion. More specifically, the Cu deposition method is an evaluation method using the fact that when a potential is applied to an oxide film formed on the wafer surface in a liquid in which Cu ions are dissolved, a current flows in a portion where the oxide film is deteriorated, and the Cu ions are deposited as Cu. It is known that defects such as COP are present at a portion where the oxide film is easily deteriorated.

The defective portion of the wafer on which Cu is deposited are analyzed under a focused light or directly visually analyzed to evaluate the distribution and the density thereof. In addition, the defective positions can also be checked with a microscopic observation such as a transmission electron microscope (TEM) or a scanning electron microscope (SEM).

The terms will be explained below.
1) FPD (Flow Pattern Defect): A wafer is sliced from a grown silicon single crystal rod, a surface distorted layer is removed by etching using a liquid mixture of a hydrofluoric acid and a nitric acid, and the surface is etched (Secco etching) by a liquid mixture of $K_2Cr_2O_7$, a hydrofluoric acid and water to form pits and a ripple pattern (a flow pattern). The flow pattern is called an FPD, and the higher the FPD density on the wafer surface, the more the poor oxide film dielectric breakdown characteristic (see JP A 4-192345).
2) SEPD (Secco Etch Pit Defect): When performing the Secco etching described above in the FPD, a defect which is accompanied by a flow pattern is called an FPD, and a defect which is not accompanied by a flow pattern is called an SEPD. It is conceivable that an SEPD (LSEPD) having 10 µm or more is due to a dislocation cluster; therefore when a device includes a dislocation cluster, current leaks through the dislocation, and the device does not function as a P-N junction.
3) LSTD (Laser Scattering Tomography Defect): A wafer is sliced from a grown silicon single crystal rod, a surface distorted layer is removed by etching using a liquid mixture of a hydrofluoric acid and a nitric acid, and then the wafer is cleaved. Infrared rays are incident on the cleaved surface (or the wafer surface) to detect rays emitted from the wafer surface (or the cleaved surface), so that scattered light caused by defects present in the wafer can be detected. This defect is called a LSTD. A scattering object observed here has been reported at an academic society or the like, and is regarded as an oxide precipitate (see Japanese Journal of Applied Physics Vol. 32, p. 3679, 1993). In addition, a recent study has reported that the scattering object is an octahedral void (hole).
4) COP (Crystal Originated Particle): This defect causes deterioration of the oxide film dielectric breakdown characteristic of the central portion of a wafer. The defect which is an FPD in the Secco etching is a COP in the SC-1 cleaning (cleaning by a liquid mixture of $NH_4OH: H_2O_2: H_2O=1:1:10$) because the liquid mixture serves as a selective etchant. The diameter of the pit is 1 µm or less, and is checked by a light scattering method.
5) L/D (large Dislocation: an abbreviation of an interstitial dislocation loop): This defect includes an LSEPD, an LFPD, and the like, and is a defect which is considered to be due to a dislocation loop. An LSEPD is an SEPD having 10 µm or more as described above. An LFPD is an FPD having a distal-end pit having a size of 10 µm or more, and is also considered to be due to a dislocation loop.

On the other hand, a silicon single crystal grown by the Czochralski method includes interstitial oxygen at a concentration of $10^{18}$ atoms/cm$^3$ as an impurity. The interstitial oxygen is precipitated by a supersaturation in a thermal history from solidification to cooling to a room temperature in the crystal growth step (hereinafter may be briefly referred to as a crystal thermal history) or in the heat treatment in the fabricating step for a semiconductor device, so that a precipitate of a silicon oxide (hereinafter may be also referred to as an oxide precipitate or simply a precipitate) is formed.

The oxide precipitate effectively serves as a site that captures a heavy metal impurity contaminated in device fabrication processes (Internal Getting: IG) to improve device characteristics or a yield. For this reason, as one of qualities of a silicon wafer, the IG capability is regarded as important.

The process of oxygen precipitation includes the formation of precipitation nuclei and the growth process thereof. In a usual as-grow wafer, the nucleus formation progresses in the crystal thermal history, and the nuclei are largely grown by heat treatment in the device fabrication processes and other processes performed thereafter, the grown nuclei being detectable as oxide precipitates. Therefore, the oxide precipitates which are present before loading the wafer into the device fabrication processes are extremely small, and do not have the IG capability. However, by loading the wafer into the device fabrication processes, the oxide precipitates are grown to large ones to have the IG capability.

On the other hand, in recent device fabrication processes, with an increase in diameter of a wafer to be used, there progresses lowering in temperature and shortening in processing time. For example, a series of device fabrication processes are performed at a temperature of 1000° C. or less, or RTP (Rapid Thermal Processing) that requires only a heat treatment time of about several ten seconds has been frequently used. Since all the heat treatment performed in the device fabrication processes may totally correspond to only the heat treatment performed at 1000° C. for about 2 hours, unlike the prior art, growth of oxide precipitates in the device fabrication processes cannot be expected. For this reason, in the device fabrication processes where low temperature and short processing time are realized, it is necessary for the wafer to have the excellent IG capability before loading it into the device fabrication processes. More specifically, large oxide precipitates detectable before loading the wafer into the device fabrication processes are desirably formed at a high density.

On the other hand, the presence of oxide precipitates in a device fabricating region in the vicinity of the wafer surface deteriorates device characteristics. For this reason, it is desirable that oxide precipitates are not present in the vicinity of the wafer surface.

In a general CZ wafer, as so-called grown-in defects generated by a thermal history when pulling crystal, in addition to grown-in oxygen precipitation nuclei, there exist voids defects formed by aggregation of vacancies. When the voids are exposed on the surface of a mirror-polished wafer, the voids turn into surface pits called COP. The presence of COP and voids in the device fabricating region deteriorates device characteristics. In particular, it is known that the COP and voids deteriorate an oxide film dielectric breakdown characteristic that is an important characteristic. From the above fact, it is desirable that not only the oxide precipitates but also the COP and voids are not present in the device fabricating region (usually at a depth of about several μm from the surface) of the wafer surface layer.

In order to annihilate the COP and voids in the wafer surface layer, high-temperature heat treatment at about 1200° C. may be performed in a hydrogen atmosphere or an inert gas atmosphere such as an argon atmosphere. In this case, it is preferable that the IG capability is given. For this reason, as a method for simultaneously realizing elimination of the COP and voids in the vicinity of the wafer surface and formation of oxide precipitates in the wafer bulk, methods for adding nitrogen when growing a crystal are proposed (for example, JP A 11-322490, 11-322491, and 2000-211995, and the like).

In the wafer added with nitrogen, voids can be easily eliminated by the high-temperature heat treatment in the vicinity of the wafer surface because the voids decrease in size, and since grown-in precipitation nuclei formed by a crystal thermal history increase in size, the precipitation nuclei are grown without being eliminated even in the high-temperature heat treatment in the wafer bulk to form oxide precipitates, with the result that the IG capability is given.

However, even when the wafer having nitrogen added thereto is used, high-temperature heat treatment at about 1200° is required to eliminate the voids in the surface layer; in some cases, small size voids which belong to the size level not detectable may be left. In addition, since large grown-in precipitation nuclei are thermally stable, they are not easily eliminated even in the wafer surface layer and may be left in the surface layer. When these defects are left in the surface layer, there occurs a problem that device characteristics are deteriorated.

In addition, when nitrogen is added when growing a crystal, the crystal producing steps are complicated, and control of a nitrogen concentration requires much labor.

DISCLOSURE OF THE INVENTION

With the foregoing problem of the prior art in view, it is an object of the present invention to provide an annealed wafer which has an excellent oxide film dielectric breakdown characteristic in a wafer surface layer serving as a device fabricating region, oxide precipitates present in a wafer bulk layer at a high density before loading the wafer into device fabrication processes, and an excellent IG capability, and a method for manufacturing the annealed wafer.

In order to solve the above problem, an annealed wafer according to the present invention is obtained by performing heat treatment on a silicon wafer manufactured from a silicon single crystal grown by the Czochralski method, wherein a good chip yield of an oxide film dielectric breakdown characteristic in a region having at least a depth of up to 5 μm from a wafer surface is 95% or more, and a density of oxide precipitates detectable in the wafer bulk and each having a size not smaller than a size showing a gettering capability is not less than $1 \times 10^9/cm^3$.

Here, the oxide film dielectric breakdown characteristic in the present invention is a TZDB (Time Zero Dielectric Breakdown) characteristic. The good chip yield is a ratio of the chips each having a dielectric breakdown electric field of 8 MV/cm or more at a decision current of 1 mA/cm².

As described above, since a denuded zone having an excellent oxide film dielectric breakdown characteristic is formed in not only the wafer surface but also a deep region of at least a depth of up to 5 μm from the wafer surface, even in a device using the deep region, the characteristics thereof are not deteriorated.

As a simple method for detecting defects in the wafer surface layer, a particle counter or a selective etching method is known. However, even when the defects are not detected by these methods, the presence of defects each having a small size that is not larger than a detection limit may deteriorate the oxide film dielectric breakdown characteristic. For this reason, it is very important for the wafer to have an excellent oxide film dielectric breakdown characteristic. Needless to say, it is preferable that a good chip yield is 100%.

At the stage before loading the wafer into the device fabrication processes, when a density of oxide precipitates detectable in the wafer bulk except for the denuded zone is $1 \times 10^9/cm^3$ or more, even in the recent device fabrication processes where the low temperature and short process time are realized, the oxide precipitate serves as a gettering site from the initial stage of the device fabrication processes, and a sufficient gettering capability can be achieved. In consideration of the mechanical strength of the wafer, the density of oxide precipitates is preferably set to $1 \times 10^{13}/cm^3$ or less.

In this case, the experimentally detectable size of the oxide precipitate (about 30 to 40 nm in diameter) serves as a measure of the size of an oxide precipitate having an IG capability. It is generally considered that oxide precipitates each having the experimentally undetectable size have an IG capability; the experimentally detectable size thereof may conceivably achieve a sufficient IG capability. Therefore, as the size having a gettering capability, a diameter of about 40 nm or more is preferably used. Such oxide precipitates are detectable by an infrared scattering tomography which is one of light scattering methods.

Furthermore, a silicon wafer subjected to heat treatment as a starting wafer of the annealed wafer according to the present invention is preferably a silicon wafer which is manufactured from a silicon single crystal grown under a condition that, when growing the silicon single crystal, a wafer entire surface is an N region which is formed outside an OSF generated in the form of a ring in a thermal oxidation process, and is free from a defective region detectable by a Cu deposition method.

In the Cu deposition method, COP and voids are detectable with high sensitivity. Therefore, it may be determined that voids are not present in a wafer which is free from a detective region detected by the Cu deposition method. In an annealed wafer obtained by heat treating a silicon wafer having no defective region detectable by the Cu deposition method, defects detectable by the Cu deposition method are not present and annealing is added, so that the oxide film dielectric breakdown characteristic of the wafer surface layer are more excellent.

As a silicon wafer to be subjected to heat treatment as a starting wafer of the annealed wafer according to the present invention, there is preferably used a wafer manufactured from a silicon single crystal grown without adding nitrogen when growing the silicon single crystal.

By adding no nitrogen, thermally stable large grown-in precipitation nuclei (for example, 40 nm or more in diameter) are not present, with the result that there is no risk of the grown-in precipitation nuclei being left in the surface layer after the heat treatment (annealing). In addition, no necessity of adding nitrogen leads to the advantages that the crystal growing step is not complicated and management or the like becomes easy.

Further, as a silicon wafer to be subjected to heat treatment as a starting wafer of the annealed wafer according to the present invention, there may be used a less defective wafer having almost no COP and voids which is manufactured from a silicon single crystal pulled under a condition that, when growing the silicon single crystal, void defects are suppressed.

The less defective wafer, as described in JP A 11-147786, JP A 11-157996 and the like, is a silicon wafer having the entire surface of N region which can be obtained by using a known technique for pulling a crystal while controlling a ratio F/G of a crystal pulling rate F and a temperature gradient G in the vicinity of a solid-liquid interface in the crystal.

A first aspect of the method for manufacturing an annealed wafer according to the present invention comprises the steps of: manufacturing a silicon wafer from a silicon single crystal obtained by growing the silicon single crystal under controlling a growth rate between a first growth rate at a boundary where a defective region left after annihilation of an OSF ring and detectable by a Cu deposition method is annihilated when the growth rate of pulling a silicon single crystal is gradually reduced, and a second growth rate at a boundary where an interstitial dislocation loop is generated when the growth rate is further gradually reduced in case of growing the silicon single crystal by a Czochralski method; keeping the silicon wafer having grown-in precipitation nuclei formed in the step of growing the silicon single crystal at a temperature of $T_4°$ C. in the range of 500° C. to 700° C. for a predetermined time $t_1$; increasing the temperature of the silicon wafer to a temperature of $T_5°$ C. in the range of 1000° C. to 1230° C. with a temperature increase rate of 5° C./min or less; and keeping the silicon wafer at the temperature of $T_5°$ C. for a predetermined time $t_2$, whereby the grown-in precipitation nuclei are grown to oxide precipitates each having a size not smaller than a size having a gettering capability and oxygen in the vicinity of the silicon wafer surface is outdiffused.

Thus, the temperature of the silicon wafer is slowly increased from a low temperature ($T_4°$ C.) to a high temperature ($T_5°$ C.) with a temperature increase rate of 5° C./min or less and then the silicon wafer is kept at a high temperature for the predetermined time, whereby the grown-in precipitation nuclei in the wafer bulk are not annihilated and can be efficiently grown to oxide precipitates each having a size not smaller than a size having a gettering capability. At the same time, by outdiffusing oxygen in the vicinity of the wafer surface, the oxygen precipitation nuclei can be eliminated, so that a DZ layer free of oxide precipitates is formed in the vicinity of the wafer surface. In addition, the DZ layer becomes a high quality one in which defects detectable by the Cu deposition method are not present. That is, according to the first aspect of the method for manufacturing an annealed wafer of the present invention, a very high quality DZ-IG structure can be formed by only simple one step heat treatment.

Here, as described above, the experimentally detectable size of the oxide precipitate (about 30 to 40 nm in diameter) serves as a measure of the size of an oxide precipitate having an IG capability. Therefore, the size having a gettering capability is preferably set to about 40 nm or more in diameter. In addition, although the upper limit of the size of the oxide precipitate is not specified, a long heat treatment time is required to largely grow the precipitates, so the diameter is preferably set to 100 nm or less.

When the temperature of $T_5°$ C. is lower than about 1000° C., a time required to grow a large oxide precipitate becomes long, and a whole process time also becomes long. The higher the temperature of $T_5°$ C., the shorter the time required to grow a large oxide precipitate, and hence the total process time can be shortened. However, at a high temperature exceeding about 1230° C., metal contamination from a heat treatment furnace becomes conspicuous; therefore, the temperature is preferably set to 1230° C. or lower.

The lower the temperature of $T_4°$ C., the higher the precipitate density. However, since the process time becomes long, the temperature of $T_4°$ C. is preferably set to about 500° C. or higher. When the temperature exceeds about 700° C., there are some cases where a sufficient precipitate density may not be obtained. Similarly, the lower the temperature increase rate R° C./min, the higher the precipitate density. However, when the temperature increase rate is too low, the process time is long; the temperature increase rate is preferably set to about 1° C./min or more. When the temperature increase rate R° C./min becomes a high rate exceeding about 5° C./min, grown-in precipitation nuclei cannot grow and may be annihilated at a high rate, and there are some cases where the sufficient precipitate density may not be obtained.

By setting the temperature increase rate R° C./min from the temperature of $T_4°$ C. to the temperature of $T_5°$ C. to 5° C./min or lower, grown-in precipitation nuclei are not annihilated to the utmost and can be efficiently grown. More specifically, since existing grown-in precipitation nuclei formed in the crystal growing step is grown, the precipitate density can be made sufficiently high without the heat treatment step for forming new oxygen precipitation nuclei, and moreover the total process time can be shortened.

In the first aspect of the method for manufacturing an annealed wafer according to the present invention, before the temperature is increased from the temperature of $T_4°$ C. to the temperature of $T_5°$ C., the keeping time $t_1$ at the temperature of $T_4°$ C. may be zero minute, but is preferably set to 15 minutes or more. In this manner, the grown-in precipitation nuclei are more difficult to annihilate, and furthermore, in addition to the grown-in precipitation nuclei, new oxygen precipitation nuclei can be generated, whereby oxygen precipitation nuclei having a higher density can be formed. When the keeping time $t_1$ is elongated, the process time becomes long. For this reason, the keeping time $t_1$ is preferably set to about 60 minutes or shorter.

Incidentally, the lower the temperature of $T_4°$ C. or the longer the keeping time $t_1$ at the temperature of $T_4°$ C. or the lower the temperature increase rate, the higher the precipitate density because new precipitation nuclei are formed in the temperature increase step.

A keeping time $t_2$ at the temperature of $T_5°$ C. is preferably set to about 30 minutes or more to reliably grow the grown-in precipitation nucleus to a size having a gettering capability or to form the DZ layer having a sufficient width. The longer the holding time $t_2$, the larger the sizes of the oxide precipitate in the wafer bulk, and hence the DZ width in the vicinity of the wafer surface can be increased. However, since the process time becomes long, the keeping time $t_2$ is preferably set to about 4 hours or shorter, and more preferably about 2 hours or shorter. On the other hand, when the keeping time $t_2$ is shorter than about 30 minutes, there arises a possibility that an oxide precipitate having a desired size or a desired DZ width may not be obtained due to a slight variation in time.

In order to sufficiently obtain the effect of the first aspect of the method for manufacturing an annealed wafer according to the present invention, an oxygen concentration of a silicon wafer to be subjected to heat treatment is desirably set to about 14 ppma or higher. When the oxygen concentration is high, the precipitate density becomes high and an excellent IG capability can be achieved. In addition, the higher the oxygen concentration, the higher the growth rate of the precipitates, with the result that a total process time becomes short. Incidentally, even though the oxygen concentration is low, for example, the temperature increase start temperature $T_4°$ C. in the temperature increase step is lowered, or the keeping time at the temperature of $T_5°$ C. is elongated, whereby the effect of the first aspect of the method for manufacturing an annealed wafer according to the present invention can be obtained. Therefore, in the first aspect of the method for manufacturing an annealed wafer according to the present invention, the upper limit of the oxygen concentration is not specified. However, in consideration of the easiness of producing a silicon single crystal, the oxygen concentration is preferably set to about 23 ppma or less. A preferable oxygen concentration is in the range of 14 to 17 ppma.

According to the first aspect of the method for manufacturing an annealed wafer of the present invention, there is obtained an effect of suppressing slip dislocation from being generated by thermal stress in device fabrication processes. It is known that the dislocation constituting the slip is subjected to pinning by an oxide precipitate. Therefore, when oxide precipitates each having a large size to some extent are formed at a high density by the first aspect of the method for manufacturing an annealed wafer of the present invention, the dislocation is subjected to pinning at a high probability, with the result that the generation of the slip dislocation is suppressed. That is, the first aspect of the method for manufacturing an annealed wafer of the present invention can be preferably used for a large diameter wafer having a diameter of 300 mm or larger where the slip dislocation is easily generated by heat treatment. In order to suppress the generation of the slip dislocation, the temperature of $T_5°$ C. is preferably set to 1200° C. or lower, and more preferably set to about 1150° C. or lower.

In addition, according to the first aspect of the method for manufacturing an annealed wafer of the present invention, there can be formed a wafer of a very high quality DZ-IG structure where not only oxide precipitates but also COP and voids are rarely present without performing high-temperature heat treatment at about 1200° C. This method is especially effectively applied to a 300 mm wafer that will be a mainstream in the future from the viewpoint of suppressing the generation of the slip.

A second aspect of the method for manufacturing an annealed wafer of the present invention comprises the steps of: manufacturing a silicon wafer from a silicon single crystal obtained by growing the silicon single crystal under controlling a growth rate between a first growth rate at a boundary where a defective region left after annihilation of an OSF ring and detectable by a Cu deposition method is annihilated when the growth rate of pulling a silicon single crystal is gradually reduced, and a second growth rate at a boundary where an interstitial dislocation loop is generated when the growth rate is further gradually reduced in case of growing the silicon single crystal by a Czochralski method; and heat treating the silicon wafer having grown-in precipitation nuclei formed in the step of growing the silicon single crystal to give a getting capability to the silicon wafer, wherein there are performed at least three steps including a temperature increase step $A_1$ for growing the grown-in precipitation nuclei, a temperature increase step $B_1$ for increasing a temperature to a higher keeping temperature, and a constant-temperature keeping step $C_1$ for growing the grown-in precipitation nuclei to oxide precipitates each having a size not smaller than a size having a gettering capability and for outdiffusing oxygen in the vicinity of the silicon wafer surface. It is desirable that the temperature increase step $A_1$, the temperature increase step $B_1$, and the constant-temperature keeping step $C_1$ are continuously performed in the order of the steps.

In the second aspect of the method for manufacturing an annealed wafer according to the present invention, the temperature increase step $A_1$ is the step of increasing a temperature from $T_6°$ C. to $T_7°$ C. at a rate of $R_3°$ C./min. It is preferable that $T_6°$ C. is 700° C. or lower, $T_7°$ C. is 800° C. to 1000° C., and $R_3°$ C./min is 3° C./min or lower.

The lower the temperature of $T_6°$ C., the higher the density of the growable grow-in precipitation nuclei. However, since there becomes long the process time required to grow the grow-in precipitation nuclei, the temperature of $T_6°$ C. is preferably set to about 500° C. or higher. When the temperature exceeds about 700° C., there are some cases where a sufficient precipitate density may not be obtained.

When the temperature of $T_7°$ C. is lower than 800° C., grown-in precipitation nuclei are not sufficiently grown in the temperature increase step $A_1$, and are annihilated at a high rate in the subsequent temperature increase step $B_1$, with the result that there are some cases where a sufficient precipitate density may not be obtained. When the temperature of $T_7°$ C. exceeds 1000° C., grown-in precipitation nuclei in the vicinity of the wafer surface are largely grown, and after the subsequent temperature increase step $B_1$ and the subsequent constant temperature keeping step $C_1$, they are still left in the vicinity of the wafer surface, with the result that the precipitate density in the DZ layer may increase.

The lower the rate of $R_3°$ C./min, the higher the precipitate density because there increases a rate of grown-in precipitation nuclei grown without being annihilated. For this reason, in order to obtain a sufficient precipitate density, the rate of $R_3°$ C./min is preferably set to 3° C./min or lower. However, when the rate is too low, the process time is elongated to spoil efficiency; the rate of $R_3°$ C./min is preferably set to 0.5° C./min or higher.

By performing the temperature increase step $A_1$, grown-in precipitation nuclei can be efficiently grown without being annihilated to the utmost. More specifically, since existing grown-in precipitation nuclei formed in the crystal growth step are grown, the precipitate density can be made sufficiently high without using a heat treatment step for forming new oxygen precipitation nuclei. In addition, a total process time can be shortened.

Before the temperature is increased from $T_6°$ C. to $T_7°$ C. in the temperature increase step $A_1$, a keeping time $t_3$ at the temperature of $T_6°$ C. may be 0 minute, but is preferably set to 30 minutes or longer. By adopting this manner, the grown-in precipitation nuclei are annihilated with more difficulty, and not only the grown-in precipitation nuclei but also new oxygen precipitation nuclei can be generated; the oxygen precipitation nuclei can be formed at a higher density. When the keeping time $T_3$ is elongated, a process time becomes long, so that the holding time is preferably set to about 4 hours or shorter.

The temperature increase step $B_1$ is the step of increasing the temperature from $T_7°$ C. to $T_8$C at a rate of $R_4°$ C./min. It is preferable that $T_7°$ C. is 800° C. to 1000° C., $T_8°$ C. is 1050° C. to 1230° C., and $R_4°$ C./min is 5° C./min or higher. In the temperature increase step $B_1$, by increasing the temperature to a high temperature in a short time, oxide precipitates in the vicinity of the wafer surface can be suppressed from being grown to make it easy to annihilate the oxide precipitates in the vicinity of the wafer surface in the subsequent constant-temperature keeping step $C_1$.

By setting the temperature of $T_8°$ C. to 1050° C. or higher, oxide precipitates in the wafer bulk can be efficiently grown to have a sufficient size, and by outdiffusing oxygen in the vicinity of the wafer surface, the oxide precipitates in the vicinity of the wafer surface can be annihilated. The higher the temperature of $T_8°$ C., the larger the precipitates in the wafer bulk besides the wider the DZ width. However, when the temperature of $T_8°$ C. is a high temperature exceeding about 1230° C., metal contamination from a heat treatment furnace becomes conspicuous; therefore the temperature of $T_8°$ C. is preferably set to 1230° C. or lower.

When the rate of $R_4°$ C. is lower than 5° C./min, the oxide precipitates in the vicinity of the wafer surface are largely grown to make it difficult to annihilate the oxide precipitates in the subsequent constant-temperature keeping step $C_1$. However, when the rate of $R_4°$ C. is excessively high, the oxide precipitates in the wafer bulk are annihilated at a high rate, and the precipitate density is lowered; therefore, the rate of $R_4°$ C. is desirably set to 10° C./min or lower.

The constant-temperature keeping step $C_1$ is the step of keeping a temperature of $T_8°$ C. for a time $t_4$. It is preferable that the temperature of $T_8°$ C. is in the range of 1050° C. to 1230° C. and that the time $t_4$ is 30 minutes or longer. The constant-temperature keeping step $C_1$ can make microscopic oxide precipitates grown in the preceding temperature increase steps $A_1$ and $B_1$ grown to large oxide precipitates having IG capabilities in the wafer bulk, and annihilated in the vicinity of the wafer surface. Since the starting wafer does not include defects detected by the Cu deposition method, the wafer subjected to heat treatment does not include defects as a matter of course. Therefore, there can be formed a wafer with a high-quality DZ-IG structure serving as a defect free DZ layer and an IG layer having an excellent IG capability.

The longer the keeping time $t_4$ at the temperature of $T_8°$ C., the larger the sizes of oxide precipitates in the wafer bulk layer besides the wider the DZ width. However, since the process time becomes long, the keeping time $t_4$ is set to about 4 hours or shorter. On the other hand, when the keeping time $t_4$ is shorter than about 30 minutes, there may not be obtained oxide precipitates each having a desired size and a desired DZ width due to a small variation in time.

In addition, by changing the keeping temperature of $T_8°$ C. and the keeping time $t_4$, the size of the oxide precipitate and the DZ width can be easily changed. It is considered that the larger the size of the oxide precipitate, the higher the IG capability. However, the larger size oxide precipitate needs the longer process time. Therefore, in order to efficiently obtain oxide precipitates having a required size and a required DZ width, it is important that there is present an effect of making it possible to easily change the size of the oxide precipitate and the DZ width.

Wafers can be unloaded from the furnace during a period between the temperature increase step $A_1$ and the temperature increase step $B_1$ and during a period between the temperature increase step $B_1$ and the constant-temperature keeping step $C_1$. However, the three steps are continuously performed, whereby the total process time can be more shortened.

After the constant-temperature keeping step $C_1$, when unloading a wafer from a heat treatment furnace, an inside temperature of the heat treatment furnace and a temperature decrease rate to the inside temperature are not specified. However, the inside temperature and the temperature decrease rate are desirably determined such that a slip due to thermal stress may not be generated. For example, after the inside temperature of the heat treatment furnace is decreased from the temperature of $T_8°$ C. to 700° C. at a rate of 3° C./min, the wafer can be unloaded from the heat treatment furnace.

In order to sufficiently obtain the effect of the second aspect of the method for manufacturing an annealed wafer according to the present invention, an oxygen concentration of a silicon wafer to be subjected to heat treatment is desirably set to about 14 ppma to 17 ppma. When the oxygen concentration is higher, a precipitate density becomes higher, and a more excellent IG capability can be obtained. However, when the oxygen concentration is excessively high, precipitates in the vicinity of the wafer surface are not easily annihilated. In addition, when the oxygen concentration is low, the density of grown-in precipitation nuclei formed in the step of growing a silicon single crystal is low, with the result that the precipitate density becomes low. Incidentally, even though the oxygen concentration is low, for example, the temperature increase starting temperature $T_6°$ C. of the temperature increase step $A_1$ is lowered, or the rate of $R_3°$ C./min is lowered, whereby the effect of the second aspect of the method for manufacturing an annealed wafer according to the present invention can be obtained.

According to the second aspect of the method for manufacturing an annealed wafer of the present invention, an effect of suppressing the generation of slip dislocation due to thermal stress in device fabrication processes. It is known that the dislocation constituting the slip is subjected to pinning by an oxide precipitate. Therefore, according to the second aspect of the method for manufacturing an annealed wafer of the present invention, when oxide precipitates each having a large size are formed at a high density, the dislocation is subjected to pinning at a high probability, and the generation of the slip dislocation is suppressed. That is, the second aspect of the method for manufacturing an annealed wafer according to the present invention can be especially preferably applied to a large diameter wafer having a diameter of 300 mm or larger, in which the slip dislocation is easily generated by heat treatment.

In order to suppress the generation of the slip dislocation, the temperature of $T_8°$ C. is preferably set to 1200° C. or lower, and more preferably about 1150° C. or lower.

In addition, according to the second aspect of the method for manufacturing an annealed wafer of the present invention, there can be formed a wafer with a high-quality DZ-IG structure where not only oxide precipitates but also COP and voids are rarely present. From the viewpoint of suppressing the generation of the slip, this is especially advantageous as to the 300 mm wafer that will be a mainstream in the future.

By performing the heat treatment on the wafer, a denuded zone (a void defect free and oxide precipitate free layer) having a sufficient depth can be obtained, and at the same time, in not only an Nv region but also an Ni region where oxygen is not easily precipitated, oxide precipitates each having a size detectable in the wafer bulk and not smaller than a size which achieves a gettering capability can be sufficiently obtained without additionally performing special heat treatment after the above heat process (i.e., at the stage before loading the wafer into the device fabrication processes).

A silicon wafer to be used in the method for the present invention is obtained according to one of the silicon single crystal growing methods disclosed in JP A 2002-201093. That is, the silicon wafer is processed from a silicon single crystal obtained in such a way that, when a growth rate of pulling the silicon single crystal is gradually reduced in case of growing the silicon single crystal by the Czochralski method, the growth rate is controlled to a growth rate between a first growth rate at a boundary where a defective region left after annihilation of an OSF ring and detectable by the Cu deposition method is annihilated and a second growth rate at a boundary where an interstitial dislocation loop is generated when the growth rate is further gradually reduced.

A wafer sliced from the single crystal rod grown by the above method is a non-defective silicon single crystal wafer which has a wafer entire surface constituted by an N region outside an OSF in the form of a ring generated when performing a thermal oxidation process and which is perfectly free from a defective region detectable by the Cu deposition method.

BEST MODE FOR CARRYING OUT THE INVENTION

Description will be given of embodiments of the present invention below based on the accompanying drawings and examples shown in the figures are presented by way of illustration, and it is needless to say that various modifications or alterations can be effected as far as not departing from the technical concept of the present invention.

An annealed wafer according to the present invention is an annealed wafer obtained by performing heat treatment on a silicon wafer manufactured from a silicon single crystal grown by the Czochralski method, wherein a good chip yield of an oxide film dielectric breakdown characteristic in a region having at least a depth of up to 5 µm from a wafer surface is 95% or more, and a density of oxide precipitates detectable in the wafer bulk and each having a size not smaller than a size showing a gettering capability is not less than $1 \times 10^9/cm^3$.

As the silicon wafer, there is preferably used a silicon wafer which is manufactured from a silicon single crystal grown under a condition that, when growing the silicon single crystal, a wafer entire surface is an N region which is formed outside an OSF generated in the form of a ring in a thermal oxidation process, and is free from a defective region detectable by a Cu deposition method. The silicon wafer can be manufactured by a single crystal growth method used in the method for the present invention (will be described later).

Also, as the silicon wafer, there may be used a less defective wafer having almost no COP and voids (i.e., a wafer having an entire surface constituted by an N region) which is manufactured from a silicon single crystal pulled under a condition that, when growing the silicon single crystal, void defects are suppressed. The less defective wafer, as described in JP A 11-147786, JP A 11-157996 and the like, can be obtained by using a known technique for pulling a crystal while controlling a ratio F/G of a crystal pulling rate F and a temperature gradient G in the vicinity of a solid-liquid interface in the-crystal.

Figure 1:
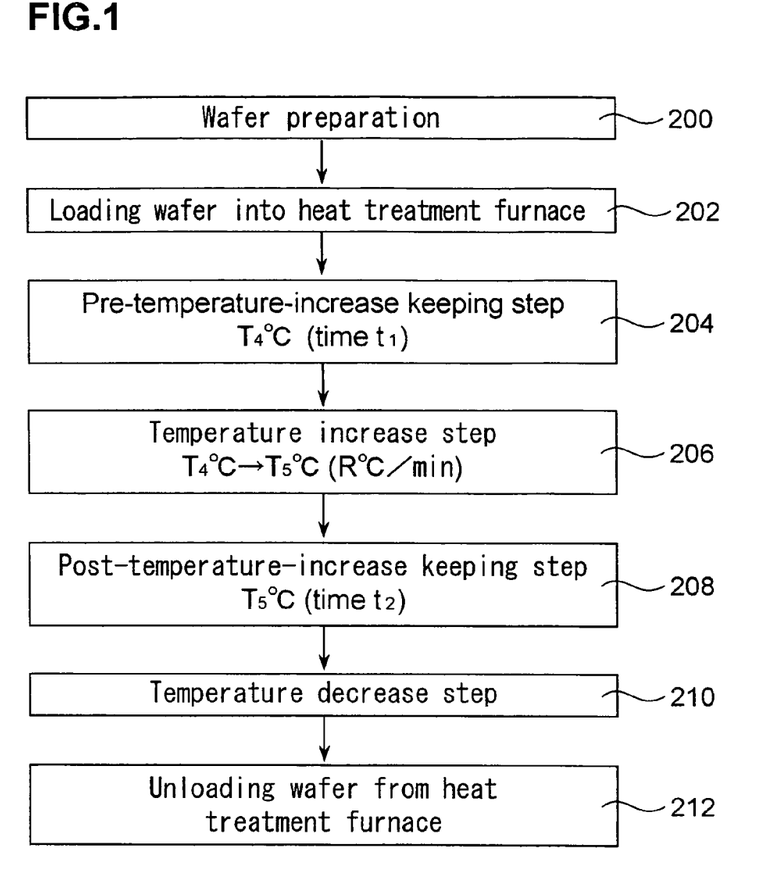
FIG. 1 is a flow chart showing an example of an order of steps of a first aspect of a method for manufacturing a silicon wafer according to the present invention.
Figure 2:
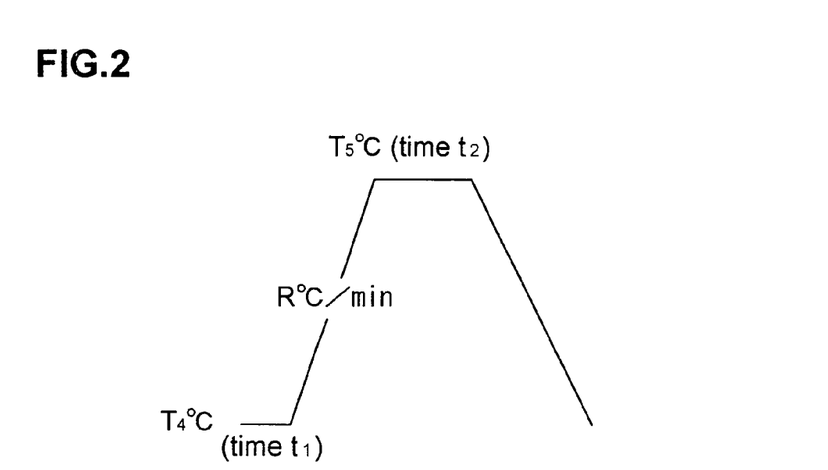
FIG. 2 is an explanatory view showing diagrammatically a main part of the order of steps in FIG. 1.

A method for manufacturing an annealed wafer according to the present invention will be described below. FIG. 1 is a flow chart showing an example of an order of steps in a first aspect of the method for manufacturing an annealed wafer according to the present invention, and FIG. 2 is an explanatory view showing diagrammatically a main part of the order of steps in FIG. 1. As shown in FIG. 1, a wafer having grown-in precipitation nuclei to be subjected to heat treatment is prepared (step 200).

As the wafer, there is preferably used a wafer which has a wafer entire surface constituted by an N region outside an OSF in the form of a ring generated when performing a thermal oxidation process and which is free from a defective region detectable by the Cu deposition method. More specifically, there may be used a silicon wafer processed from a silicon single crystal obtained in such a way that, when a growth rate of pulling the silicon single crystal is gradually reduced in case of growing the silicon single crystal by the Czochralski method, the growth rate is controlled to a growth rate between a first growth rate at a boundary where a defective region left after annihilation of an OSF ring and detectable by the Cu deposition method is annihilated and a second growth rate at a boundary where an interstitial dislocation loop is generated when the growth rate is further gradually reduced.

Figure 5:
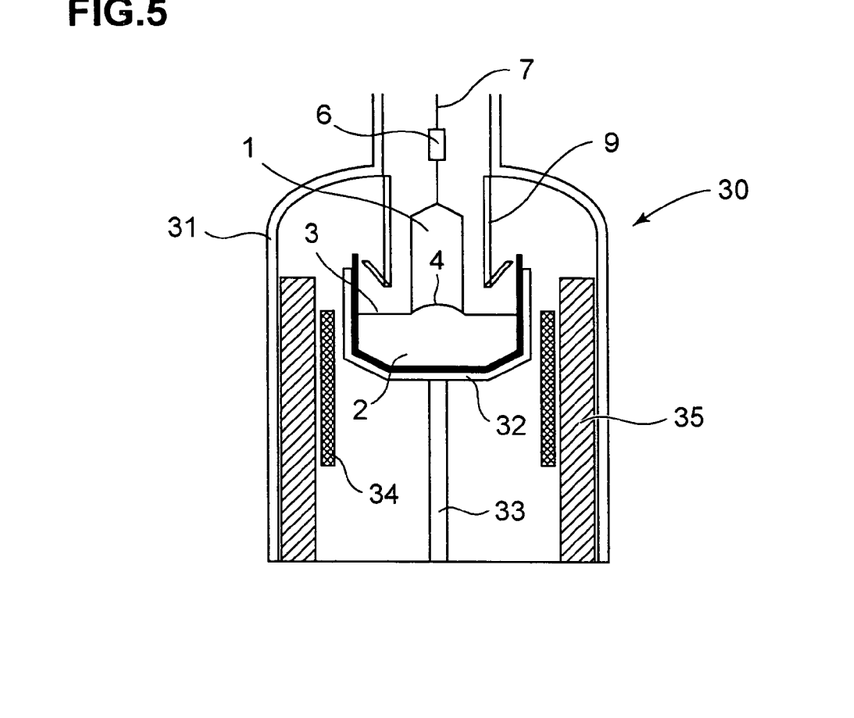
FIG. 5 is a schematic explanatory view showing an example of a single crystal pulling apparatus used in a single crystal pulling step in the method of the present invention.

An embodiment of a structure of an apparatus for pulling the silicon single crystal will be described below with reference to FIGS. 5 and 6. As shown in FIG. 5, the single crystal pulling apparatus 30 comprises a pulling chamber 31, a crucible 32 arranged in the pulling chamber 31, a heater 34 arranged around the crucible 32, a crucible holding shaft 33 and a rotating mechanism (not shown) which rotates the crucible 32, a seed chuck 6 for holding a seed crystal of silicon, a wire 7 for pulling the seed chuck 6, and a winding mechanism (not shown) for rotating or winding the wire 7. The crucible 32 includes an inner quartz crucible containing a silicon melt 2, and an outer graphite crucible arranged outside the quartz crucible. A heat insulating material 35 is arranged around the heater 34.

In order to set a growth condition for the single crystal growth method, an annular graphite cylinder (heat shielding plate) 9 is arranged. In FIG. 6, an annular outside heat-insulating material 10 is arranged around a crystal solid-liquid interface 4. The annular outside heat insulating material 10 is arranged with an interval of 2 to 20 cm between the lower end thereof and a surface 3 of the silicon melt 2. In addition, a cooling gas may be sprayed, or a cylindrical cooling apparatus that shields radiant heat to cool a single crystal may be arranged. Particularly, in recent years, there is frequently used a so-called MCZ method (described below) where a magnet (not shown) is arranged outside the pulling chamber 31 to apply a magnetic field to the silicon melt 2 in a horizontal direction, a vertical direction, or the like, so that the convection of the melt is suppressed to stably grow the single crystal. In FIGS. 5 and 6, reference numeral 4 denotes a solid-liquid interface indicating a boundary between a silicon single crystal and a silicon melt.

A single crystal growth method using the single crystal pulling apparatus 30 will be described below. First, a high-purity silicon polycrystal material is heated to the melting point (about 1420° C.) or higher to melt the material in the crucible 32. Next, the wire 7 is unwounded to bring the distal end of the seed crystal into contact with the almost central portion of the surface of the silicon melt 2 or dip the distal end in the silicon melt 2. Thereafter, the crucible holding shaft 33 is rotated in a proper direction, and the wire 7 is wound while being rotated to pull the seed crystal, so that single crystal growth is started. Subsequently, the pulling rate and temperature are appropriately controlled, so that an almost columnar single crystal rod 1 can be obtained.

Figure 6:
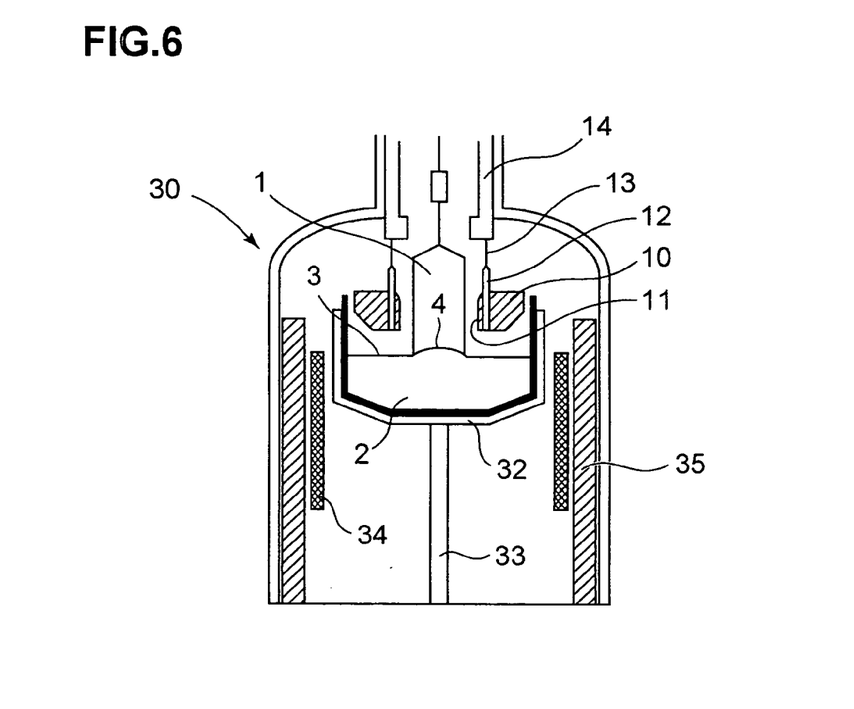
FIG. 6 is a schematic diagram for explaining another example of the single crystal pulling apparatus used in the single crystal pulling step in the method of the present invention.

In this case, it is very important that, as shown in FIG. 5 or 6, an annular graphite cylinder (heat insulating plate) 9 and the annular outside heat insulating material 10 are arranged such that a temperature range of from the melting point of the crystal in the vicinity of the melt surface to 1400° C. can be controlled in a peripheral space of the liquid portion in the single crystal rod 1 on the melt surface in the pulling chamber 31.

More specifically, in order to control the inside temperature of the furnace, for example, as shown in FIG. 6, the annular outside heat insulating member 10 may be arranged in the pulling chamber 31 such that the interval between the lower end thereof and the melt surface is set to the range of from 2 to 20 cm. In this manner, there becomes small the difference between a temperature gradient Gc [° C./cm] of the central portion of the crystal and a temperature gradient Ge of the peripheral portion of the crystal; for example, the inside temperature of the furnace can be controlled such that the temperature gradient of the peripheral portion of the crystal is lower than that of the central portion thereof. The annular outside heat insulating member 10 is arranged outside a graphite cylinder 12, and a heat insulating material 11 is also arranged inside the graphite cylinder 12. The upper portion of the graphite cylinder 12 is connected to a metal cylinder 13, and a cooling cylinder 14 is arranged on the metal cylinder 13, in which a coolant is flowed to forcibly cool the single crystal.

A silicon single crystal wafer obtained by slicing the silicon single crystal obtained as described above is a non-defective wafer which has a wafer entire surface constituted by an N region outside an OSF in the form of a ring generated when performing a thermal oxidation process and which is free from a defective region detectable by the Cu deposition method. By using the wafer described above, there is preferable an oxide film dielectric breakdown characteristic of a surface layer of the wafer subjected to heat treatment.

In addition, it is preferable not to add nitrogen to the wafer in the crystal growth step. In this manner, there is a poor chance of leaving oxide precipitates in the surface layer of the wafer subjected to heat treatment and doping of nitrogen is not necessary, so that the crystal producing steps are not complicated and management thereof or the like becomes easy.

The wafer manufactured by the above method is loaded into the heat treatment furnace (step 202). The heat treatment furnace is kept at a temperature of $T_4°$ C. (500° C. to 700° C.). Before the next temperature increase step, the loaded wafer is kept at the temperature of $T_4°$ C. for a predetermined time (time $t_1$), preferably, 15 minutes or longer (the pre-temperature-increase keeping step: step 204).

As well shown in FIG. 2, the inside temperature of the furnace is increased from $T_4°$ C. to $T_5°$ C. set between the temperature of 1000° C. to 1230° C. at a temperature increase rate of R° C./min which is 5° C./min or lower (the temperature increase step: step 206). In this temperature increase step (step 206), grown-in precipitation nuclei at a high density can be efficiently grown without being annihilated.

When it is desired to change the density of the oxide precipitates depending on the degree of contamination in device fabrication processes, for example, $T_5°$ C. is set to about 1100° C., the temperature increase rate R° C./min is fixed to about 3° C./min, and $T_4°$ C. is changed, so that the density can be easily changed.

The wafer is kept at the temperature of $T_5°$ C. for a predetermined time (time $t_2$) (the post-temperature-increase keeping step: step 208). Here, the keeping time is preferably set at about 30 minutes or longer. In the post-temperature-increase keeping step (step 208), microscopic oxide precipitates grown in a wafer bulk in the previous temperature increase step (step 206) are grown to oxide precipitates each having a desired size of about 30 nm to 40 nm, preferably, about 50 nm or more in diameter, and at the same time, oxygen in the vicinity of the wafer surface is outdiffused to annihilate oxygen precipitation nuclei, so that a DZ layer free from oxide precipitates can be formed.

Thus, the object of the post-temperature-increase keeping step (step 208) at $T_5°$ C. is to further grow oxide precipitates grown in the wafer bulk in the temperature increase step (step 206) and to outdiffuse oxygen in the vicinity of the wafer surface. Therefore, if the object can be achieved, this step is not limited to the step of keeping the wafer at a constant temperature, and it can be changed into a step with a slight change in temperature (temperature increase, temperature decrease, or the like). In addition, by changing $T_5°$ C. and the keeping time $t_2$ in the post-temperature-increase keeping step (step 208), the size of oxide precipitates can be easily changed.

After the heat treatment, for example, the temperature in the heat treatment furnace is decreased from $T_5°$ C. to 700° C. at a rate of 2° C./min (the temperature decrease step: step 210), the wafer is unloaded from the heat treatment furnace (step 212). Incidentally, the temperature decrease rate and the ultimate temperature after the temperature decrease are not limited to specific values.

An atmosphere for the heat treatment is not limited. For example, an oxygen atmosphere, an oxygen-nitrogen mixture atmosphere, an argon atmosphere, and a hydrogen atmosphere, and the like are usable. In a non-oxidation atmosphere such as argon or hydrogen, an oxide film is not formed on a wafer surface, with the result that outdiffusion of oxygen in the non-oxidation atmosphere may be preferably accelerated more than that in an oxidation atmosphere.

In order to sufficiently obtain the effect of the heat treatment method of the present invention, the oxygen concentration of the silicon wafer to be subjected to heat treatment is desirably set to about 14 to 17 ppma. When the oxygen concentration is higher, a precipitate density becomes higher, and a more excellent IG capability can be given. When the oxygen concentration is higher, a growth rate of the precipitates becomes higher, with the result that a total process time is shortened.

Figure 3:
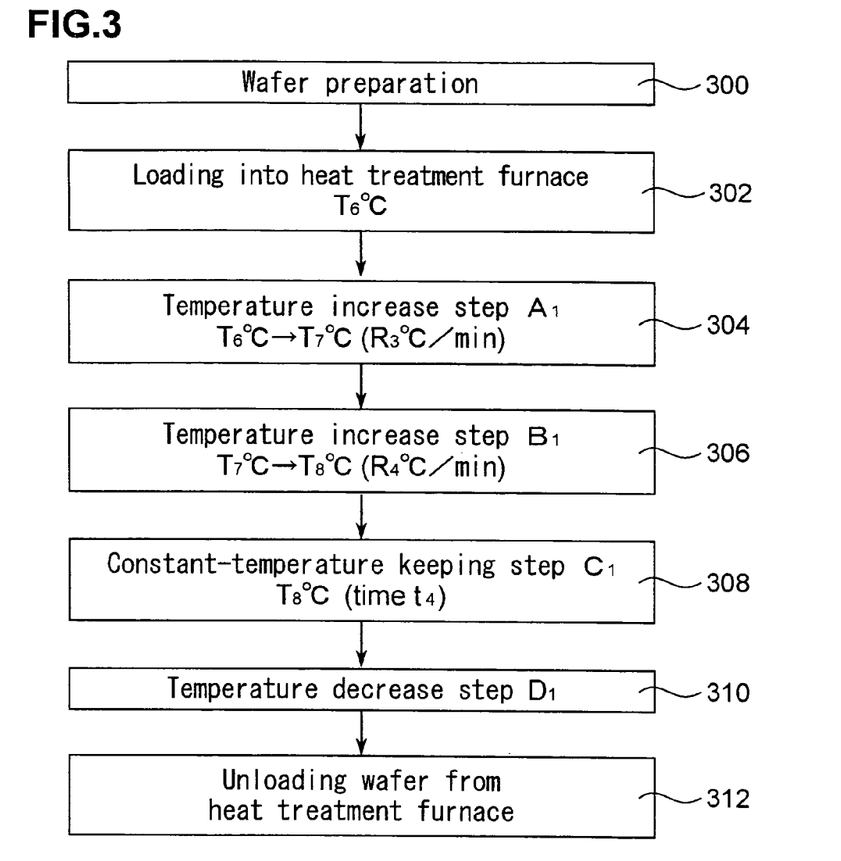
FIG. 3 is a flow chart showing an example of an order of steps of a second aspect of the method for manufacturing a silicon wafer according to the present invention.
Figure 4:
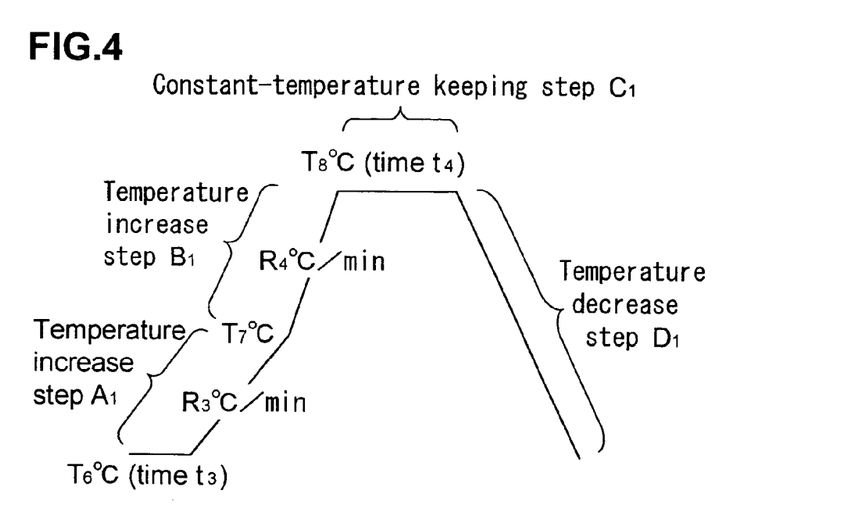
FIG. 4 is an explanatory view showing diagrammatically a main part of the order of steps in FIG. 3.

FIG. 3 is a flow chart showing an example of an order of steps of a second aspect of the method for manufacturing a silicon wafer according to the present invention, and FIG. 4 is an explanatory view showing diagrammatically a main part of the order of steps in FIG. 3. As shown in FIGS. 3 and 4, the second aspect of the method for manufacturing an annealed wafer according to the present invention includes, as necessary steps, a temperature increase step $A_1$ (step 304) for growing grown-in precipitation nuclei formed in the a silicon single crystal growing step, a temperature increase step $B_1$ (step 306) for efficiently increasing a temperature to a higher keeping temperature, and a constant-temperature keeping step $C_1$ (step 308) for growing the grown-in precipitation nuclei to oxide precipitates each having a size not smaller than a size having a gettering capability and for outdiffusing oxygen in the vicinity of the silicon wafer surface. Incidentally, in FIGS. 3 and 4, as a preferable example, there is shown a case in which the temperature increase step $A_1$ (step 304), the temperature increase step $B_1$ (step 306), and the constant-temperature keeping step $C_1$ (step 308) are continuously performed.

As shown in FIG. 3, there is prepared a wafer to be subjected to heat treatment and having grown-in precipitation nuclei (step 300). As the wafer, a silicon wafer used in the first aspect of the method for manufacturing an annealed wafer according to the present invention is similarly used. The wafer is loaded into a heat treatment furnace kept at a temperature of $T_6°$ C. (step 302). Here, $T_6°$ C. is preferably set to 700° C. or lower.

Next, as well shown in FIG. 4, an inside temperature of the furnace is increased from $T_6°$ C. to $T_7°$ C. at a rate of $R_3°$ C./min (the temperature increase step $A_1$: step 304). Here, $T_7°$ C. is preferably set to the range of 800° C. to 1000° C., and the rate of $R_3°$ C./min is preferably set to 3° C./min or lower. Also, before increasing a temperature from $T_6°$ C. to $T_7°$ C. in the temperature increase step $A_1$ (step 304), the keeping time $t_3$ at $T_6°$ C. may be 0, but preferably 30 minutes or longer. In this temperature increase step $A_1$ (step 304), high density grown-in precipitation nuclei can be efficiently grown without being annihilated.

Next, the inside temperature of the heat treatment furnace is increased from $T_7°$ C. to $T_8°$ C. at a rate of $R_4°$ C. (the temperature increase step $B_1$: step 306). Here, $T_8°$ C. is preferably set to the range of 1050° C. to 1230° C., and the rate of $R_4°$ C. is preferably set to 5° C./min or higher. In this temperature increase step $B_1$ (step 306), the inside temperature of the furnace is increased to a higher keeping temperature within a short time to make it possible to easily annihilate precipitates in the vicinity of the wafer surface without growing unnecessary precipitates.

Further, $T_8°$ C. is kept for a keep time $t_4$ (the constant-temperature keeping step $C_1$: step 308). Here, $T_8°$ C. is preferably set to the range of 1050° C. to 1230° C., and the keeping time $t_4$ is preferably set to about 30 minutes or longer. In this constant-temperature keeping step $C_1$ (step 308), microscopic oxide precipitates grown in the wafer bulk in the previous temperature increase steps (steps 304 and 306) are grown to oxide precipitates each having a desired size of about 40 nm or larger, more preferably, about 50 nm or larger in diameter, and at the same time oxygen in the vicinity of the wafer surface is outdiffused to annihilate the oxide precipitates, so that a DZ layer free from oxide precipitates can be formed.

In this case, since the oxide precipitates in the vicinity of the wafer surface can be more perfectly annihilated, a DZ layer of very high quality can be efficiently obtained.

The object of the constant-temperature keeping step $C_1$ (step 308) at $T_8°$ C. is to further grow oxide precipitates grown in the wafer bulk in the temperature increase step (steps 304 and 306) and to outdiffuse oxygen in the vicinity of the wafer surface. Therefore, if the object can be achieved, the step is not limited to the step of keeping the wafer at a constant temperature, and can be changed into a step with a slight change in temperature (temperature increase, temperature decrease, or the like). In addition, when $T_8°$ C. and the keeping time $t_4$ in the constant-temperature keeping step $C_1$ (step 308) are changed, the size of oxide precipitates and a DZ width can be easily changed.

After the heat treatment, for example, after the inside temperature of the heat treatment furnace is decreased from $T_8$ to 700° C. at a rate of 3° C./min (the temperature decrease step: step 310), the wafer is unloaded from the heat treatment furnace (step 312). Incidentally, the temperature decrease rate and the ultimate temperature after the temperature decrease are not limited to specific values.

An atmosphere for the heat treatment is not limited. For example, an oxygen atmosphere, an oxygen-nitrogen mixture atmosphere, an argon atmosphere, and a hydrogen atmosphere, and the like are usable. In a non-oxidation atmosphere such as argon or hydrogen, an oxide film is not formed on a wafer surface; with the result that outdiffusion of oxygen in the non-oxidation atmosphere may be preferably accelerated more than that in an oxidation atmosphere.

In order to sufficiently obtain the effect of the second aspect of the method for manufacturing an annealed wafer according to the present invention, the oxygen concentration of the silicon wafer to be subjected to heat treatment is desirably set to the range on the order of 14 ppma to 17 ppma. When the oxygen concentration is higher, a density of precipitates becomes higher, and a more excellent IG capability can be given. However, when the oxygen concentration is excessively high, precipitates in the vicinity of the wafer surface are not easily annihilated. When the oxygen concentration decreases, a density of grown-in precipitation nuclei formed in the step of growing a silicon single crystal becomes low, and a density of precipitates becomes low. Incidentally, even though the oxygen concentration is low, by decreasing the temperature increase start temperature $T_6°$ C. of the temperature increase step $A_1$, or by decreasing the rate of $R_3°$ C./min, the effect of the second aspect of the method for manufacturing an annealed wafer according to the present invention can be obtained.

EXAMPLES

The present invention will be described below in more specific manner by way of the following examples which should be construed as illustrative rather than restrictive.

Example 1

A silicon single crystal was pulled by the Czochralski method in a region of (Nv−Dn)+Ni in FIG. 10 (JP A 2002-201093) under controlling a growth rate between a first growth rate at a boundary where a defective region (Dn) left after annihilation of an OSF ring and detectable by a Cu deposition method is annihilated when the growth rate of pulling a silicon single crystal was gradually reduced, and a second rate at a boundary (a boundary between an N region and an I region) where an interstitial dislocation loop is generated when the growth rate is further gradually reduced, so that there was prepared a mirror-polished silicon wafer manufactured from a silicon single crystal pulled in a condition that the generation of voids was suppressed.

In the growth of the crystal, nitrogen was not added. The wafer has a diameter of 8 inches, a crystal orientation of <100>, and a resistivity of about 10 Ω·cm (boron doped). Wafers of two types having different oxygen concentrations were prepared. The oxygen concentrations are about 15 and 17 ppma (JEIDA scale), respectively. JEIDA is the abbreviated name of Japan Electronic Industry Development Association (at present, JEIDA is changed into JEITA: Japan Electronics and Information Technology industries Association). The wafers were evaluated by the Cu deposition method, with the result that no defects were detected.

Then, the wafers were subjected to heat treatment in an argon atmosphere. More specifically, the wafers were loaded into a heat treatment furnace at a temperature of 700° C. and kept for 30 minutes. Thereafter, the temperature was increased to 900° C. at a rate of 3° C./min, increased to 1150° C. at a rate of 5° C./min, and the wafers were kept at 1150° C. for 4 hours. After the keeping, the inside temperature of the heat treatment furnace was decreased to 700° C. at a rate of 3° C./min, and the wafers were unloaded from the heat treatment furnace.

On each of the wafers (annealed wafers) subjected to the heat treatment, a polishing process was performed by mechanical-chemical polishing in a depth of the order of 3 to 13 μm from the wafer surface, and oxide film dielectric breakdown characteristics [TZDB (Time Zero Dielectric Breakdown) good chip yields] at respective depths were measured. In the measurement of the TZDB good chip yield, thermal oxide films each having a thickness of about 25 nm were formed on the wafer surfaces, and phosphorous-doped polysilicon electrodes (electrode area: 8 mm$^2$) were manufactured on the respective thermal oxide films. The determination current value was set to 1 mA/cm$^2$, and a wafer having a dielectric breakdown electric field of 8 MV/cm or more was determined as a good chip. Measurement was performed at 100 points on the surface of each wafer, and good chip yields were calculated. The results are shown in FIG. 7.

Figure 7:
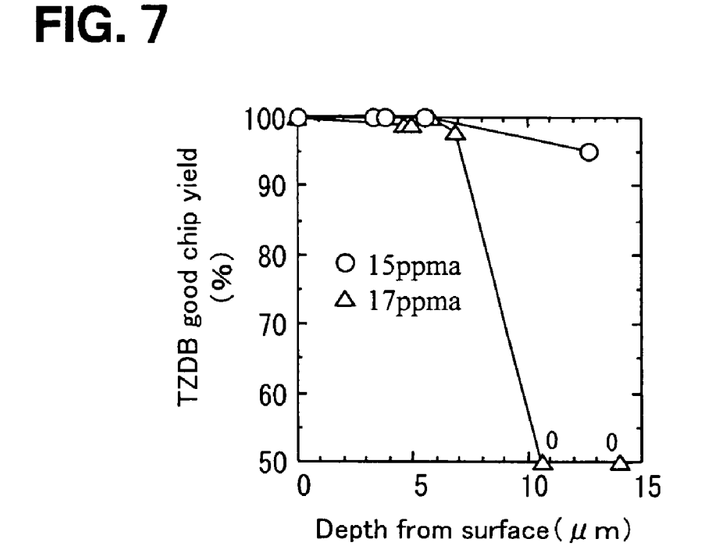
FIG. 7 is a graph showing a relationship between a depth from the surface of an annealed wafer and a TZDB good chip yield in Example 1.

As is apparent from FIG. 7, in all cases of the oxygen concentrations, the good chip yields in the regions having a depth of at least up to 5 μm were almost 100%, and those in the regions having a depth of up to on the order of 6 to 7 μm were 95% or more.

Furthermore, on the wafers subjected to the heat treatment, a density of the oxide precipitates in each of the wafer bulks was measured by infrared scattering tomography without addition of further heat treatment. According to the infrared scattering tomography, oxide precipitates each having a size with a diameter of 40 nm or more can be detected. As a result, when the oxygen concentration was about 15 ppma, the density of oxide precipitates was about $5 \times 10^9$/cm$^3$, and when the oxygen concentration was about 17 ppma, the density was about $9 \times 10^9$/cm$^3$. Therefore, it was found that oxide precipitates having a high density were detected without device fabrication processes.

Example 2

The silicon mirror-polished wafers manufactured in the same conditions as those in Example 1 were subjected to the following heat treatment in an argon atmosphere. That is, the wafers were kept at 700° C. for 1 hour, the temperature was increased to 900° C. at a rate of 3° C./min, and increased from 900° C. to 1200° C. at a rate of 5° C./min, and the wafers were kept at 1200° C. for 1 hour. After the keeping, the inside temperature of the heat treatment furnace was decreased to 700° C. at a rate of 3° C./min, and the wafers were unloaded from the heat treatment furnace.

On the wafers (annealed wafers) subjected to the heat treatment, TZDB good chip yields and densities of the oxide precipitates were measured under the same conditions as those in Example 1. As a result, in all cases of the oxygen concentrations, as in Example 1, the good chip yields in the regions having a depth of at least up to 5 μm were almost 100%, and those in the regions having a depth of up to on the order of 6 to 7 μm were 95% or more. With respect to densities of the oxide precipitates, when the oxygen concentration was about 15 ppma, the density of oxide precipitates was about $4 \times 10^9$/cm$^3$, and when the oxygen concentration was about 17 ppma, the density was about $8 \times 10^9$/cm$^3$. Therefore, it was found that oxide precipitates having a high density were detected without device fabrication processes.

Comparative Example 1

There was prepared a mirror-polished silicon wafer manufactured from a silicon single crystal pulled at pulling rate slightly faster than that in Example 1. In the growth of the crystal, nitrogen was not added. The wafer has a diameter of 8 inches, a crystal orientation of <100>, and a resistivity of about 10 Ω·cm (boron doped). The oxygen concentration of the wafer was about 15 ppma. When the wafer was evaluated by the Cu deposition method, defects were detected.

Figure 8:
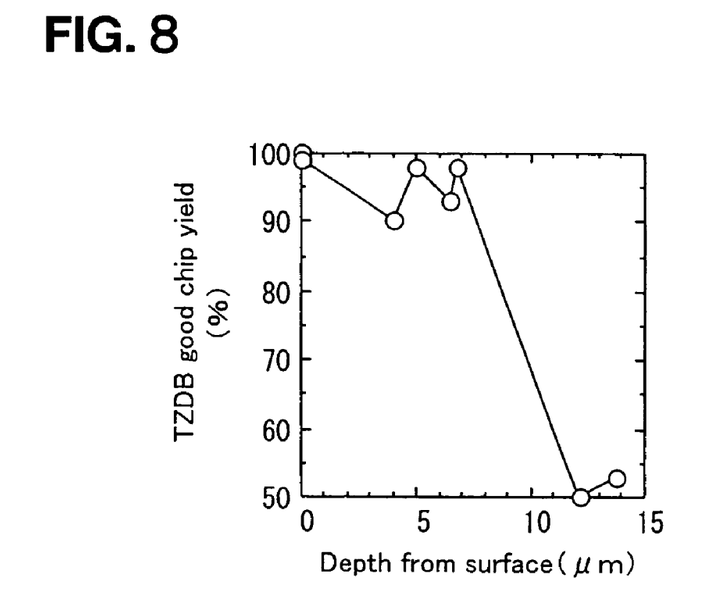
FIG. 8 is a graph showing a relationship between a depth from the surface of an annealed wafer and a TZDB good chip yield in Comparative Example 1.

Next, the wafer was subjected to the heat treatment under the same conditions as those in Example 1. A TZDB good chip yield is shown in FIG. 8. From the result, it is found that good chip yields in the region having a depth of up to about 6 μm were about 90% or more at a high level, but in comparison with the result in Example 1 (FIG. 7), the wafer in Comparative Example 1 is inferior to that in Example 1.

The density of the oxide precipitates in the wafer bulk was about $5 \times 10^9/cm^3$, which was the same level as that in Example 1.

As described above, when there is subjected to heat treatment a silicon wafer in which a defective region detected by the Cu deposition method is not present, the good chip yield of the oxide film dielectric breakdown characteristic in the region having a depth of at least up to 5 μm from the wafer surface is 95% or more, and a density of defects detectable in the wafer bulk is $1 \times 10^9/cm^3$ or more at the stage before the wafer is loaded into device fabrication processes. That is, there can be obtained an annealed wafer including a wafer surface layer having an excellent oxide film dielectric breakdown characteristic and a wafer bulk layer having an excellent gettering capability.

CAPABILITY OF EXPLOITATION IN INDUSTRY

As described above, according to the present invention, there can be provided an annealed wafer which has a wafer surface layer serving as a device fabricating region and having an excellent oxide film dielectric breakdown characteristic, and a wafer bulk layer in which oxide precipitates are present at a high density at the stage before the wafer is loaded into the device fabrication processes to give an excellent IG capability, and a method for manufacturing the annealed wafer.

The invention claimed is:

1. An annealed wafer obtained by performing heat treatment on a silicon wafer manufactured from a silicon single crystal grown by the Czochralski method, wherein a good chip yield of an oxide film dielectric breakdown characteristic in a region having at least a depth of up to 5 μm from a wafer surface is 95% or more, and a density of oxide precipitates detectable in the wafer bulk and each having a size not smaller than a size showing a gettering capability is not less than $1 \times 10^9/cm^3$.

2. The annealed wafer according to claim 1, wherein the silicon wafer is manufactured from a silicon single crystal grown under a condition that, when growing the silicon single crystal, a wafer entire surface is an N region which is formed outside of an OSF generated in the form of a ring in a thermal oxidation process, and is free from a defective region detectable by a Cu deposition method.

3. The annealed wafer according to claim 2, wherein the silicon wafer is manufactured from a silicon single crystal grown without adding nitrogen when growing the silicon single crystal.

4. The annealed wafer according to claim 1, wherein the silicon wafer is manufactured from a silicon single crystal grown without adding nitrogen when growing the silicon single crystal.

5. A method for manufacturing an annealed wafer comprising the steps of: manufacturing a silicon wafer from a silicon single crystal obtained by growing the silicon single crystal under controlling a growth rate between a first growth rate at a boundary where a defective region left after annihilation of an OSF ring and detectable by a Cu deposition method is annihilated when the growth rate of pulling a silicon single crystal is gradually reduced, and a second growth rate at a boundary where an interstitial dislocation loop is generated when the growth rate is further gradually reduced in case of growing the silicon single crystal by a Czochralski method; keeping the silicon wafer having grown-in precipitation nuclei formed in the step of growing the silicon single crystal at a temperature of $T_4°$ C. in the range of 500° C. to 700° C. for a predetermined time $t_1$; increasing the temperature of the silicon wafer to a temperature of $T_5°$ C. in the range of 1000° C. to 1230° C. with a temperature increase rate of 5° C./min or less; and keeping the silicon wafer at the temperature of $T_5°$ C. for a predetermined time $t_2$, whereby the grown-in precipitation nuclei are grown to oxide precipitates each having a size not smaller than a size having a gettering capability and oxygen in the vicinity of the silicon wafer surface is outdiffused.

6. The method for manufacturing an annealed wafer according to claim 5, wherein the keeping time $t_1$ at the temperature of $T_4°$ C. is 15 minutes or more.

7. The method for manufacturing an annealed wafer according to claim 6, wherein the keeping time $t_2$ at the temperature of $T_5°$ C. is 30 minutes or more.

8. The method for manufacturing an annealed wafer according to claim 5, wherein the keeping time $t_2$ at the temperature of $T_5°$ C. is 30 minutes or more.

9. A method for manufacturing an annealed wafer comprising the steps of: manufacturing a silicon wafer from a silicon single crystal obtained by growing the silicon single crystal under controlling a growth rate between a first growth rate at a boundary where a defective region left after annihilation of an OSF ring and detectable by a Cu deposition method is annihilated when the growth rate of pulling a silicon single crystal is gradually reduced, and a second growth rate at a boundary where an interstitial dislocation loop is generated when the growth rate is further gradually reduced in case of growing the silicon single crystal by a Czochralski method; and heat treating the silicon wafer having grown-in precipitation nuclei formed in the step of growing the silicon single crystal to give a getting capability to the silicon wafer, wherein there are performed at least three steps including a temperature increase step $A_1$ for growing the grown-in precipitation nuclei, a temperature increase step $B_1$ for increasing a temperature to a higher keeping temperature, and a constant-temperature keeping step $C_1$ for growing the grown-in precipitation nuclei to oxide precipitates each having a size not smaller than a size having a gettering capability and for outdiffusing oxygen in the vicinity of the silicon wafer surface.

10. The method for manufacturing an annealed wafer according to claim 9, wherein the temperature increase step $A_1$, the temperature increase step $B_1$, and the constant-temperature keeping step $C_1$ are continuously performed.

11. The method for manufacturing an annealed wafer according to claim 10, wherein the temperature increase step $A_1$ is for increasing a temperature from $T_6°$ C. to $T_7°$ C. at a rate of $R_3°$ C./min, $T_6°$ C. is 700° C. or less, $T_7°$ C. is in the range of 800° C. to 1000° C., and $R_3°$ C./min is 3° C./min or less.

12. The method for manufacturing an annealed wafer according to claim 11, wherein before increasing the temperature from $T_6°$ C. to $T_7°$ C. in the temperature increase step $A_1$, the temperature of $T_6°$ C. is kept for 30 minutes or more.

13. The method for manufacturing an annealed wafer according to claim 12, wherein the temperature increase step $B_1$ is for increasing the temperature from $T_7°$ C. to $T_8$ C at a rate of $R_4°$ C./min, $T_7°$ C. is in the range of 800° C. to 1000° C., $T_8°$ C. is in the range of 1050° C. to 1230° C., and $R_4°$ C./min is 5° C./min or more.

14. The method for manufacturing an annealed wafer according to claim 11, wherein the temperature increase step $B_1$ is for increasing the temperature from $T_7°$ C. to $T_8$ C at a rate of $R_4°$ C./min, $T_7°$ C. is in the range of 800° C. to 1000° C., $T_8$° C. is in the range of 10500° to 1230° C., and $R_4$° C./min is 5° C./min or more.

15. The method for manufacturing an annealed wafer according to claim 10, wherein before increasing the temperature from $T_6$° C. to $T_7$° C. in the temperature increase step $A_1$, the temperature of $T_6$° C. is kept for 30 minutes or more.

16. The method for manufacturing an annealed wafer according to claim 15, wherein the temperature increase step $B_1$ is for increasing the temperature from $T_7$° C. to $T_8$ C at a rate of $R_4$° C./min, $T_7$° C. is in the range of 800° C. to 1000° C., $T_8$° C. is in the range of 1050° C. to 1230° C., and $R_4$° C./min is 5° C./min or more.

17. The method for manufacturing an annealed wafer according to claim 10, wherein the temperature increase step $B_1$ is for increasing the temperature from $T_7$° C. to $T_8$ C at a rate of $R_4$° C./min, $T_7$° C. is in the range of 800° C. to 1000° C., $T_8$° C. is in the range of 10500° to 1230° C., and $R_4$° C./min is 5° C./min or more.

18. The method for manufacturing an annealed wafer according to claim 9, wherein the temperature increase step $A_1$ is for increasing a temperature from $T_6$° C. to $T_7$° C. at a rate of $R_3$° C./min, $T_6$° C. is 700° C. or less, $T_7$° C. is in the range of 800° C. to 1000° C., and $R_3$° C./min is 3° C./min or less.

19. The method for manufacturing an annealed wafer according to claim 18, wherein before increasing the temperature from $T_6$° C. to $T_7$° C. in the temperature increase step $A_1$, the temperature of $T_6$° C. is kept for 30 minutes or more.

20. The method for manufacturing an annealed wafer according to claim 19, wherein the temperature increase step $B_1$ is for increasing the temperature from $T_7$° C. to $T_8$ C at a rate of $R_4$° C./min, $T_7$° C. is in the range of 800° C. to 1000° C., $T_8$° C. is in the range of 1050° C. to 1230° C., and $R_4$° C./min is 5° C./min or more.

21. The method for manufacturing an annealed wafer according to claim 18, wherein the temperature increase step $B_1$ is for increasing the temperature from $T_7$° C. to $T_8$ C at a rate of $R_4$° C./min, $T_7$° C. is in the range of 800° C. to 1000° C., $T_8$° C. is in the range of 10500° to 1230° C., and $R_4$° C./min is 5° C./min or more.

22. The method for manufacturing an annealed wafer according to claim 9, wherein before increasing the temperature from $T_6$° C. to $T_7$° C. in the temperature increase step $A_1$, the temperature of $T_6$° C. is kept for 30 minutes or more.

23. The method for manufacturing an annealed wafer according to claim 22, wherein the temperature increase step $B_1$ is for increasing the temperature from $T_7$° C. to $T_8$ C at a rate of $R_4$° C./min, $T_7$° C. is in the range of 800° C. to 1000° C., $T_8$° C. is in the range of 1050° C. to 1230° C., and $R_4$° C./min is 5° C./min or more.

24. The method for manufacturing an annealed wafer according to claim 9, wherein the temperature increase step $B_1$ is for increasing the temperature from $T_7$° C. to $T_8$ C at a rate of $R_4$° C./min, $T_7$° C. is in the range of 800° C. to 1000° C., $T_8$° C. is in the range of 1050° C. to 1230° C., and $R_4$° C./min is 5° C./min or more.

* * * * *